(12) United States Patent
Mushika (10) Patent No.: US 7,064,880 B2
(45) Date of Patent: Jun. 20, 2006

(54) PROJECTOR AND PROJECTION METHOD

(75) Inventor: Yoshihiro Mushika, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/936,302

(22) Filed: Sep. 8, 2004

(65) Prior Publication Data

US 2005/0068599 A1    Mar. 31, 2005

(30) Foreign Application Priority Data

Sep. 25, 2003   (JP)   ............................. 2003-332660

(51) Int. Cl.
*G02B 26/00* (2006.01)
(52) U.S. Cl. ...................... 359/237; 359/238
(58) Field of Classification Search ................ 359/237, 359/238, 290, 291, 634; 355/53
See application file for complete search history.

(56) References Cited

U.S. PATENT DOCUMENTS

| 6,363,504 B1* | 3/2002 | Rhodes et al. ............. 714/724 |
| 2004/0081351 A1* | 4/2004 | Ganot et al. ................. 382/151 |
| 2005/0088719 A1* | 4/2005 | Patel et al .................. 359/290 |

FOREIGN PATENT DOCUMENTS

JP    10-112579 A    4/1998

OTHER PUBLICATIONS

Durr, et al., "Characterization of Spatial Light Modulators for Micro Lithography", *Proceedings of SPIE*, vol. 4985, pp. 211-221, (2003).

* cited by examiner

*Primary Examiner*—Timothy Thompson
*Assistant Examiner*—Jerry Fang
(74) *Attorney, Agent, or Firm*—Akin Gump Strauss Hauer & Feld, LLP (57) ABSTRACT

A projector includes: a spatial light modulator, which receives pattern data, representing a pattern to be formed on a projection plane, and which spatially modulates incoming light in accordance with the pattern data; and a projection optical system for projecting the light, which has been reflected from the spatial light modulator, onto the projection plane in a reduced size. The spatial light modulator includes: an array of micromirrors to be driven in accordance with the pattern data; a substrate to support the array of micromirrors thereon; and a driving section, which is able to change the tilt of each micromirror with respect to the substrate and the displacement of the micromirror perpendicularly to the substrate on a micromirror-by-micromirror basis.

13 Claims, 5 Drawing Sheets

PROJECTOR AND PROJECTION METHOD

BACKGROUND OF THE INVENTION

1. Field of the Invention

The present invention relates to a projector and projection method, which can form an image with high resolution, and more particularly relates to a projector and projection method that can be used effectively to define a circuit pattern in a lithography process in the field of semiconductor integrated circuit technologies.

2. Description of the Related Art

Projectors for performing a drawing operation with a spatial light modulator such as a micromirror array have been proposed. A system using Digital Micromirror Device (DMD; a product name) is well known as such a projector. A system of that type is expected to work in not only display applications but also various other fields such as semiconductor lithography and photo printing.

Japanese Laid-Open Publication No. 10-112579 discloses a technique of applying the DMD to a semiconductor lithography process. According to that technique, no photomask is used for exposure purposes but an exposure process is carried out by presenting an image representing a circuit pattern on the DMD and then projecting the light reflected from the DMD onto a photoresist.

In a normal DMD, each micromirror changes its tilt angles in two steps. However, in the spatial light modulator disclosed by Peter Duerr, et al. in "Characterization of Spatial Light Modulators for Micro Lithography", Proc. of SPIE Vol. 4985, pp. 211–221 (Jan. 28–29, 2003), the tilt angle of each micromirror is changed in multiple steps with a multi-bit signal. Duerr at al. also disclosed that a lithography process should be carried out with a micromirror array driven by a multi-bit control. More specifically, according to Duerr's technique, micromirrors associated dark regions on the projection plane are given a maximum tilt, while micromirrors associated with bright regions on the projection plane are given a minimum tilt. Meanwhile, other micromirrors associated with the boundary regions between those dark and bright regions are given an intermediate tilt. And if the intermediate tilt angle is changed, then the boundary between the dark and bright regions will shift according to Duerr et al.

However, as for the conventional arrangement described above, it is difficult to apply a high-resolution masking technique such as a phase shifting method, and therefore, the size of the pattern being drawn on the projection plane cannot be reduced beyond a certain limit.

For example, when the DMD is used as micromirrors as disclosed in Japanese Laid-Open Publication No. 10-112579, each of those micromirrors changes the quantity of transmitted light digitally (i.e., by switching between ON and OFF states) and works just like a normal mask with an opening. A pair of diffracted light rays, coming from two adjacent bright regions, has the same phase and interferes with each other. As a result, it is difficult to separate the images of the two bright regions from each other on the projection plane.

Essentially the same statement applies to the analog control of mirror tilt angles as disclosed by Duerr et al. That is to say, each mirror can control nothing but its tilt angle. Accordingly, whenever a half of a mirror surface is raised, the other half is lowered so that the average displacement of the overall mirror surface is always equal to zero. This means that the reflected light, modulated by such a mirror, has an average phase shift of zero. Thus, a pair of diffracted light rays, coming from two adjacent bright regions, also has the same phase and interferes with each other. Consequently, it is difficult to separate the images of the two bright regions from each other on the projection plane, too.

For that reason, each of the two conventional techniques described above results in decreased resolution as compared with a situation where a phase shift mask is used.

SUMMARY OF THE INVENTION

In order to overcome the problems described above, preferred embodiments of the present invention provide a projector and projection method that can increase the resolution by shifting the phase of modulated light while a pattern is being drawn in accordance with pattern data.

A projector according to a preferred embodiment of the present invention preferably includes: a spatial light modulator, which receives pattern data, representing a pattern to be formed on a projection plane, and which spatially modulates incoming light in accordance with the pattern data; and a projection optical system for projecting the light, which has been reflected from the spatial light modulator, onto the projection plane in a reduced size. The spatial light modulator preferably includes: an array of micromirrors to be driven in accordance with the pattern data; a substrate to support the array of micromirrors thereon; and a driving section, which is able to change the tilt of each micromirror with respect to the substrate and the displacement of the micromirror perpendicularly to the substrate on a micromirror-by-micromirror basis.

In one preferred embodiment of the present invention, the driving section preferably changes the position of each micromirror in accordance with the pattern data. The position is preferably defined by the displacement of the micromirror perpendicularly to the substrate and the tilt of the micromirror with respect to the substrate.

In this particular preferred embodiment, the driving section is preferably able to displace each micromirror perpendicularly to the substrate in multiple steps in accordance with the pattern data.

More particularly, the driving section preferably changes the biaxial tilt of each micromirror with respect to the substrate in multiple steps in accordance with the pattern data.

In still another preferred embodiment, the driving section preferably allows each micromirror to take one of three different positions, which are defined as first, second and third positions, respectively, in accordance with the pattern data. The micromirror in the first position preferably tilts with respect to the substrate and preferably deviates the reflected light substantially out of an aperture pupil of the projection optical system. The micromirrors in the second and third positions preferably displace perpendicularly to the substrate to mutually different degrees, but preferably both deviate the reflected light out of the aperture pupil of the projection optical system.

In this particular preferred embodiment, the driving section preferably produces a phase difference between the light reflected by the micromirror in the second position and the light reflected by the micromirror in the third position so that the phase of the former light is reverse of that of the latter light.

In that case, the micromirror in the second position and the micromirror in the third position are preferably adjacent to each other so as to interpose the micromirror in the first position between themselves.

In a specific preferred embodiment, the phase difference is preferably substantially equal to 180 degrees.

In yet another preferred embodiment, the pattern data is preferably generated by a pattern data generator. The pattern data generator preferably provides one of various combinations of multi-stage pattern data settings for each micromirror so as to displace the micromirror perpendicularly to the substrate, and tilt the micromirror biaxially with respect to the substrate, differently from the other micromirrors.

In that case, the pattern data is preferably provided so as to tilt each micromirror biaxially with respect to the substrate in multiple stages.

In yet another preferred embodiment, the pattern to be formed on the projection plane is preferably a pattern to define a circuit component, and the projection plane is preferably defined on a photosensitive resist.

In yet another preferred embodiment, the pattern data generator preferably generates pattern data to correct the aberration of the projection optical system.

A projector according to another preferred embodiment of the present invention preferably includes: a spatial light modulator, which receives pattern data, representing a pattern to be formed on a projection plane, and which spatially modulates incoming light in accordance with the pattern data; and a projection optical system for projecting the light, which has been modulated by the spatial light modulator, onto the projection plane. The spatial light modulator preferably includes an array of modulators, which are able to change the amplitude and/or phase of the incoming light in accordance with the pattern data. Each modulator preferably selectively takes one of three different positions that are defined as first, second and third positions, respectively. The modulator in the first position preferably decreases the amplitude of the modulated light on the projection plane to less than a predetermined value. The modulator in the second position preferably keeps the amplitude of the modulated light on the projection plane equal to or greater than the predetermined value. And the modulator in the third position preferably keeps the amplitude of the modulated light on the projection plane equal to or greater than the predetermined value and preferably produces a phase difference with respect to the light modulated by the modulator in the second position.

An image forming method according to a preferred embodiment of the present invention preferably includes the steps of: driving a micromirror array, in which multiple micromirrors are arranged in columns and rows, thereby tilting the micromirrors and/or displacing the micromirrors along an optical axis on a micromirror-by-micromirror basis; and projecting light onto the micromirror array and then getting the light reflected from the micromirrors projected onto a projection plane, thereby forming an image on the projection plane.

A projection method according to a preferred embodiment of the present invention preferably includes the steps of: providing a spatial light modulator including a plurality of modulators, each of which is able to change the amplitude and/or phase of light; allowing light to enter the spatial light modulator, getting the light modulated by the modulators, and then projecting the modulated light onto a projection plane, thereby forming an image; and inputting first, second and third pattern data to the spatial light modulator. The first pattern data is preferably defined such that the amplitude of the modulated light on the projection plane is decreased to less than a predetermined value. The second pattern data is preferably defined such that the amplitude of the modulated light on the projection plane is kept equal to or greater than the predetermined value. And the third pattern data is preferably defined such that the amplitude of the modulated light on the projection plane is kept equal to or greater than the predetermined value and that a phase difference is produced with respect to the light that has been modulated by the modulator provided with the second pattern data.

According to various preferred embodiments of the present invention described above, by using a spatial light modulator that includes an array of micromirrors to be driven in accordance with pattern data and a substrate to support the array of micromirrors thereon, the micromirrors are tilted with respect to the substrate and/or displaced perpendicularly to the substrate. In this manner, the phase of incoming light is shifted and the resolution of the pattern to be drawn on the projection plane is increased.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, a projector according to a first specific preferred embodiment of the present invention will be described with reference to the accompanying drawings.

Figure 1:
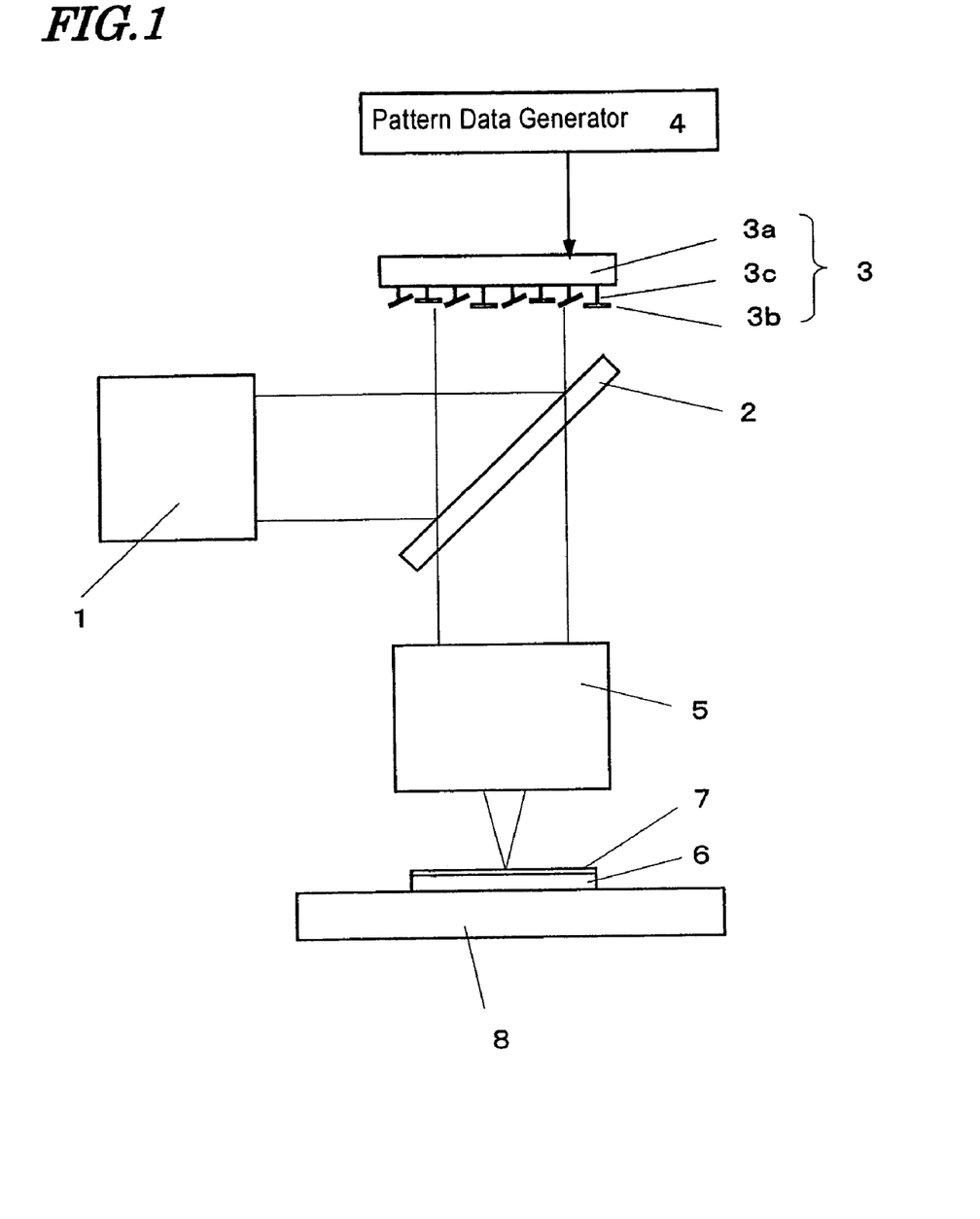
FIG. 1 is a schematic representation showing a configuration for a projector according to a preferred embodiment of the present invention.

First, referring to FIG. 1, illustrated is a projector according to the first preferred embodiment. As shown in FIG. 1, the projector includes a light source 1, a micromirror array 3, a beam splitter 2, and a reducing projection optical system 5. The micromirror array 3 spatially modulates the light radiated from the light source 1. The beam splitter 2 reflects a portion of the light radiated from the light source 1 toward the micromirror array 3 and transmits the light that has been reflected from the micromirror array 3. And the reducing projection optical system 5 projects the light, which has been transmitted through the beam splitter 2, in a reduced size.

Under the reducing projection optical system 5, there is a wafer stage 8 on which a wafer 6 is mounted. A photosensitive photoresist layer 7 may be provided on the wafer 6, for example.

A pattern data generator 4 is connected to the micromirror array 3 so as to supply an electrical signal defining a pattern to be transferred onto the wafer 6 (i.e., pattern data) to the micromirror array 3.

The light source 1 is either a coherent light source or a partially coherent light source and preferably includes a source that generates a radiation such as excimer laser beam, discharge plasma or laser produced plasma and a wavelength filter that transmits only light with a required wavelength. In a preferred embodiment, the light source 1 supplies a light beam, having a particular wavelength that is shorter than that of an ultraviolet (UV) ray, in a uniform illuminance distribution.

The micromirror array 3 for use in this preferred embodiment includes a substrate 3a and a great many micromirrors 3b, which are arranged in columns and rows on the substrate 3a so as to be driven independently by actuators 3c. In this preferred embodiment, each micromirror 3b has a square shape with a length of about 1 μm to about 5 μm each side. That huge number of micromirrors 3b, arranged in a two-dimensional array, makes one reflective surface all together. Each of those micromirrors 3b is not only tilted with respect to the substrate 3a but also displaced perpendicularly to the principal surface of the substrate 3a by an actuator 3c connected to its back surface. Both the perpendicular displacement and tilt of the micromirror 3b are controlled with multi-bit signals. One micromirror 3b and its associated actuator 3c make up one optical modulator. This micromirror array 3 will be described in further detail later.

The pattern data generator 4 generates pattern data, representing a pattern to be drawn, and supplies that data as an electrical signal to the micromirror array 3. In this preferred embodiment, the pattern data represents a drive voltage to be applied to each actuator 3c of the micromirror array 3 in 16 bits.

A portion of the reflected light, which has been modulated by the micromirror array 3, is transmitted through the beam splitter 2 and then imaged on the photoresist 7 on the wafer 6 by way of the reducing projection optical system 5 with as high a magnification as 1/10 to 1/50. In this preferred embodiment, the photoresist 7 is a chemically amplified photoresist, which is sensitive to a short-wave light ray falling within the ultraviolet range. The wafer 6 is held on the wafer stage 8 by a vacuum suction technique and subjected to this exposure process while being shifted by a precision stepper (not shown).

Next, the micromirror array 3 will be described in detail with reference to FIG. 2, which is an exploded perspective view of the micromirror array 3 according to the first preferred embodiment of the present invention. This micromirror array 3 has the same configuration as the deformable mirror that was disclosed by the applicant of the present application in PCT International Application No. PCT/JP02/12344.

Figure 2:
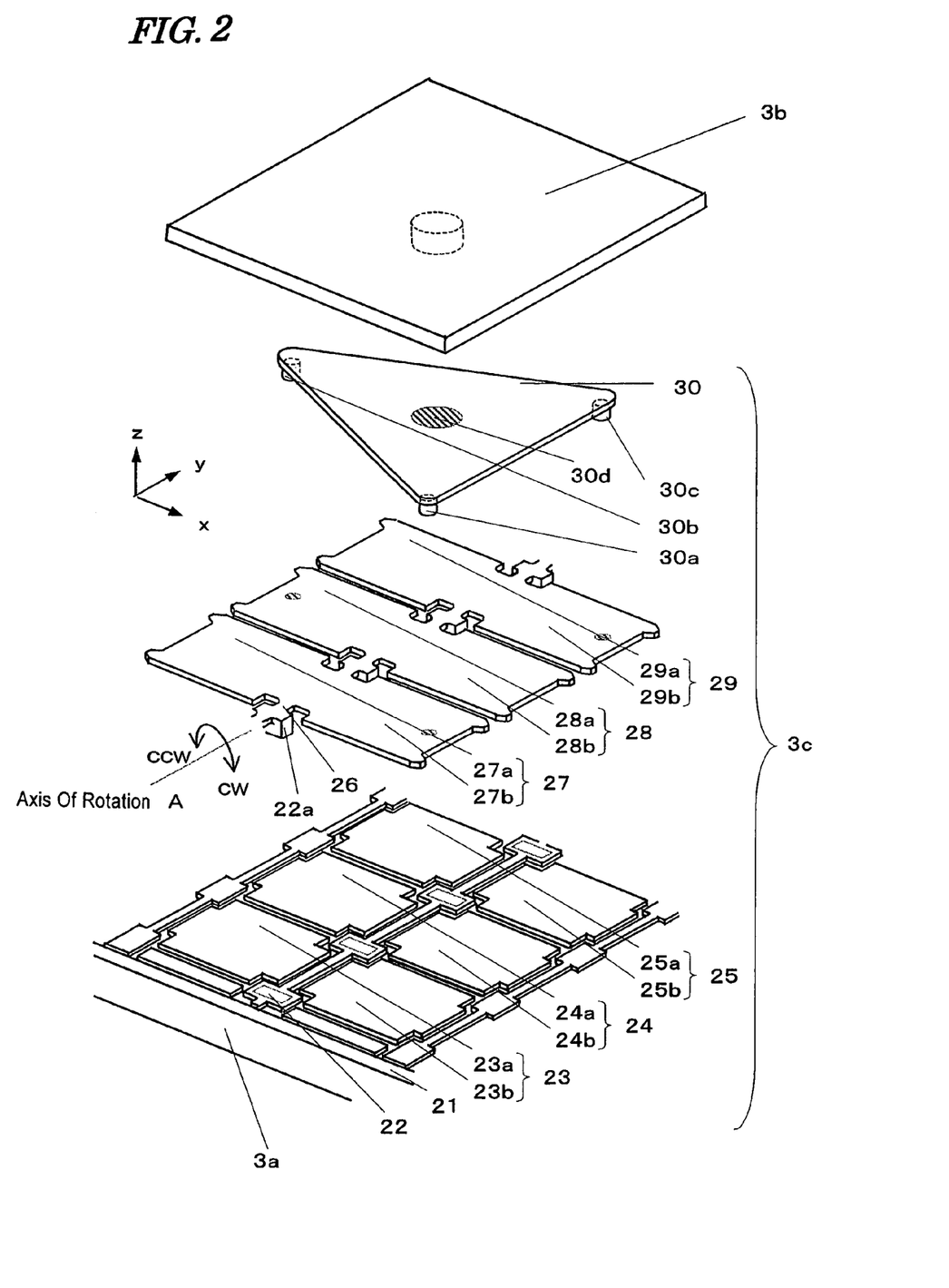
FIG. 2 is an exploded perspective view of the micromirror array shown in FIG. 1.

In FIG. 2, just one modulator (consisting of one micromirror 3b and its associated actuator 3c) is illustrated on a large scale. But an actual micromirror array 3 is a two-dimensional array in which a lot of modulators are arranged in columns and rows.

As the fixed portion of the actuator 3c, an insulating layer 21 is provided on a substrate 3a and a base 22 and fixed electrodes 23, 24 and 25 are arranged on the insulating layer 21 as shown in FIG. 2. The base 22 and fixed electrodes 23 to 25 are formed by patterning a conductive film of aluminum (Al), polysilicon or any other suitable material. Each of these fixed electrodes 23, 24 and 25 is divided into two fixed-electrode pieces 23a & 23b, 24a & 24b and 25a & 25b. These fixed-electrode pieces 23a, 23b, 24a, 24b, 25a and 25b are connected to the driver circuit on the substrate 3a by way of via metals (not shown), which are provided in the insulating layer 21. The driver circuit can apply mutually independent voltages, all of which fall within the range of 0 V to 5 V, to the fixed-electrode pieces 23a, 23b, 24a, 24b, 25a and 25b. Each of the voltages applied to these six fixed-electrode pieces 23a, 23b, 24a, 24b, 25a and 25b may be set to a multi-bit value of around 16 bits, for example. On the other hand, the base 22 is grounded. A portion of the base 22 functions as a supporting post 22a for supporting the movable electrodes.

As the movable portion of the actuator 3c, yokes 27, 28 and 29 are secured to the supporting post 22a via a hinge 26. Furthermore, an intermediate coupling member 30 for coupling these yokes 27, 28 and 29 to the micromirror 3b is also provided.

These yokes 27, 28 and 29 face their associated fixed electrodes 23, 24 and 25, respectively, so as to function as "movable electrodes". The yokes 27, 28 and 29 are formed by patterning an electrically conductive material such as aluminum (Al) or polysilicon, and are electrically continuous with the base 22 so as to have the ground potential. Each of these yokes 27, 28 and 29 has a first portion 27a, 28a or 29a and a second portion 27b, 28b or 29b, which respectively face the fixed-electrode pieces 23a & 23b, 24a & 24b and 24a & 25b. For example, if a drive voltage is applied to the fixed-electrode piece 23a for the yoke 27, then the first portion 27a will be attracted toward the fixed-electrode piece 23a. On the other hand, if a drive voltage is applied to the fixed-electrode piece 23b, then the second portion 27b will be attracted toward the fixed-electrode piece 23b. In this manner, the rotational force can be produced around the axis A of rotation either clockwise CW or counterclockwise CCW. The same statement applies to the other yokes 28 and 29, too.

The intermediate coupling member 30 includes three protrusions 30a, 30b and 30c, which are coupled to the second portion 27b of the yoke 27, the first portion 28a of the yoke 28 and the second portion 29b of the yoke 29, respectively. Accordingly, by driving and rotating the yokes 27, 28 and 29 independently of each other, the displacements of the protrusions 30a, 30b and 30c are controllable independently and the position of the intermediate coupling member 30 is fixed. The micromirror 3b and intermediate coupling member 30 are coupled together at the hatched portion 30d, which is approximately the center portion of the intermediate coupling member 30. Thus, the position of the intermediate coupling member 30 defines the position of the micromirror 3b. These protrusions 30a, 30b and 30c and the intermediate coupling member 30 may be prepared in different processes. For example, the protrusions 30a, 30b and 30c may be made of a flexible material such as polyimide. As is clear from the foregoing description of the configuration of this preferred embodiment, by applying drive voltages selectively and independently to the fixed-electrode pieces 23a, 23b, 24a, 24b, 25a and 25b, the micromirror 3b can be driven bidirectionally (i.e., in positive and negative directions), no matter whether the micromirror 3b needs to be displaced in the z direction or tilted around the x axis and/or y axis.

The micromirror array 3 having such a configuration can be formed effectively by micro-electromechanical system (MEMS) technology that has advanced remarkably recently.

Hereinafter, it will be described with reference to FIGS. 3 and 4 how the micromirror array 3 shifts the phase. First, referring to FIG. 3, shown is how the position of the micromirror array 3 and the light quantity distribution on the projection plane change when a phase shift operation is carried out.

Figure 3A:
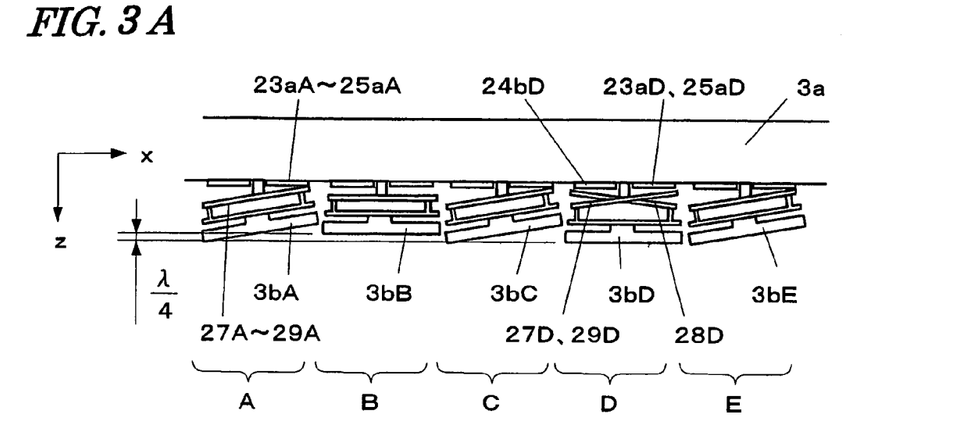
FIG. 3 shows how the position of the micromirror array 3 and the light quantity distribution on the projection plane change when a phase shift operation is carried out.

FIG. 3A is an enlarged cross-sectional view of the micromirror array 3. Five modulators A through E are illustrated in FIG. 3A but any other number of modulators may be included in the micromirror array 3. In the following description, each member of the modulator A, B, C, D or E is identified by a reference numeral with the subscript A, B, C, D or E indicating which modulator that member belongs to.

In the modulator A shown in FIG. 3A, a maximum voltage is applied to the fixed electrode pieces 23aA, 24aA and 25aA. Thus, the yokes 27A, 28A and 29A rotate counterclockwise and the micromirror 3bA is in a first position, i.e., tilts at the maximum angle.

The modulators C and E are in the same position as the modulator A. That is to say, the micromirrors 3bC and 3bE of the modulators C and E are also in the first position with the maximum tilt angle.

The incoming light Lin is reflected by these micromirrors 3bA, 3bC and 3bE so as to be deviated out of the aperture pupil of the reducing projection optical system 5 shown in FIG. 1. As a result, dark portions are defined in portions of the photoresist 7 corresponding to the modulators A, C and E, respectively, in FIG. 1.

As for the modulator B, no voltage is applied to any fixed electrode piece thereof, and the mirror 3bB takes a second position. The second position is equivalent to no deformation state (rest position) and the tilt angle of the mirror and its displacement in the z direction (i.e., along the optical axis) are both zero. Since the mirror surface of the micromirror 3bB is perpendicular to the propagation direction of the incoming light Lin, the reflected light is deviated within the aperture pupil of the reducing projection optical system 5 to define bright portions on the photoresist 7.

In the modulator D, predetermined voltages are applied to the fixed electrode piece 24bD and to the two fixed electrode pieces 23aD and 25aD. Thus, the yokes 27D and 29D rotate counterclockwise, while the yoke 28D rotates clockwise. As a result, the micromirror 3bD takes a third position in which the mirror 3bD has displaced to a predetermined degree in the z direction, i.e., perpendicularly to the substrate 3a. In this case, the micromirror 3bD has a tilt angle of zero degrees and has displaced by $\lambda/4$, where $\lambda$ is the wavelength of the incoming light Lin. That is to say, there is a relative displacement of $\lambda/4$ between the micromirrors 3bB and 3bD and an optical path length difference of $\lambda/2$ will be produced when the incoming light leaves the mirror along the optical paths. Consequently, a phase difference of 180 degrees is created between the light reflected from the micromirror 3bB and the light reflected from the micromirror 3bD. Since the mirror surface of the micromirror 3bD is perpendicular to the propagation direction of the incoming light Lin, the reflected light is deviated within the aperture pupil of the reducing projection optical system 5 to define bright portions on the photoresist 7 as the projection plane.

Figure 3B:
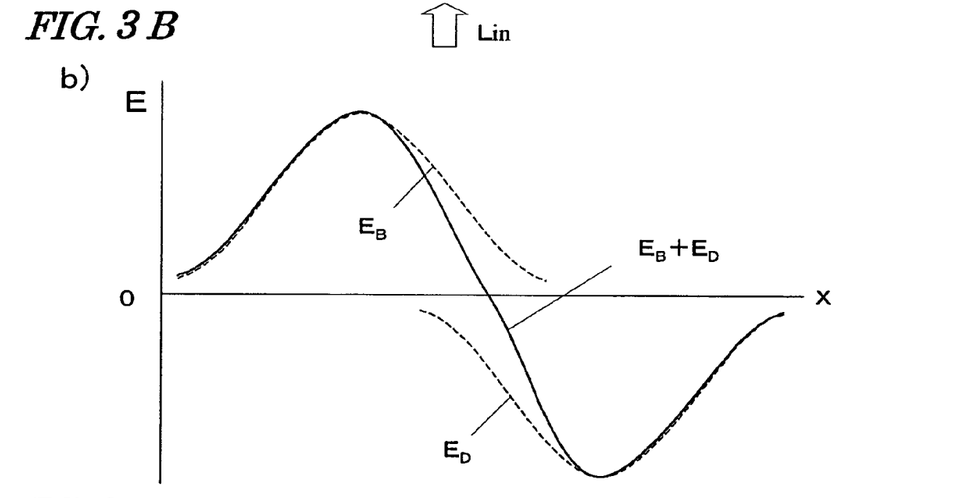

FIG. 3B shows the intensity distribution of the electric field produced by the light, which has been reflected from the micromirror array shown in FIG. 3A, on the surface of the photoresist 7. In FIG. 3B, the dashed curves $E_B$ and $E_D$ show the distributions of the electric fields created by the light reflected from the micromirror 3bB and the light reflected from the micromirror 3bD, respectively. The electric fields $E_B$ and $E_D$ of the light reflected from the micromirror 3bB and the light reflected from the micromirror 3bD have a phase difference of 180 degrees and the electric field distribution $E_B+E_D$ on the photoresist 7 has reduced values because the overlapping portions at the skirts of the electric field distributions $E_B$ and $E_D$ cancel each other.

Figure 3C:
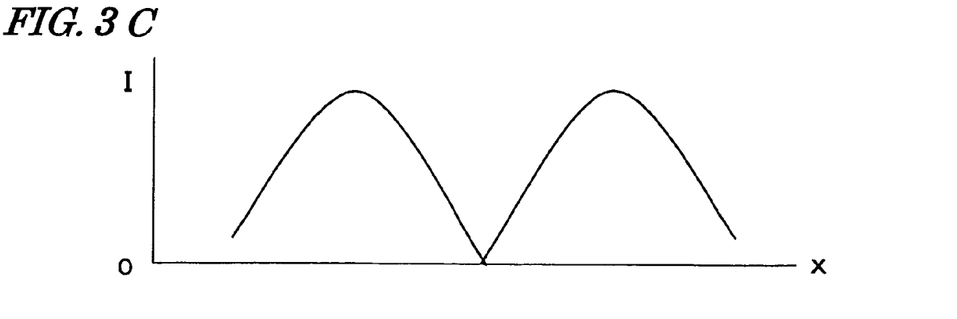

The light quantity is proportional to the square of the electric field intensity. Thus, the light quantity distribution on the photoresist 7 is represented by the curve shown in FIG. 3C. As shown in FIG. 3C, the dark portion between the two bright portions is reproduced at a high contrast ratio and the image components representing the two bright portions are distinctly separated from each other on the projection plane.

By producing a relative displacement of $\lambda/4$ between the micromirrors 3bB and 3bD to create two adjacent bright portions in this manner, the light rays reflected from these two mirrors interfere with each other with a relative phase difference of 180 degrees maintained. As a result, effects equivalent to those caused by a Levenson type phase shift mask can be achieved and the resolution of the bright and dark pattern can be increased.

In the preferred embodiment described above, each of the bright and dark portions is produced with a single micromirror for the sake of simplicity. However, it is naturally possible to produce the bright or dark portion with a plurality of micromirrors.

Next, it will be described with reference to FIG. 4 what if the phase shift operation were not carried out.

Figure 4A:
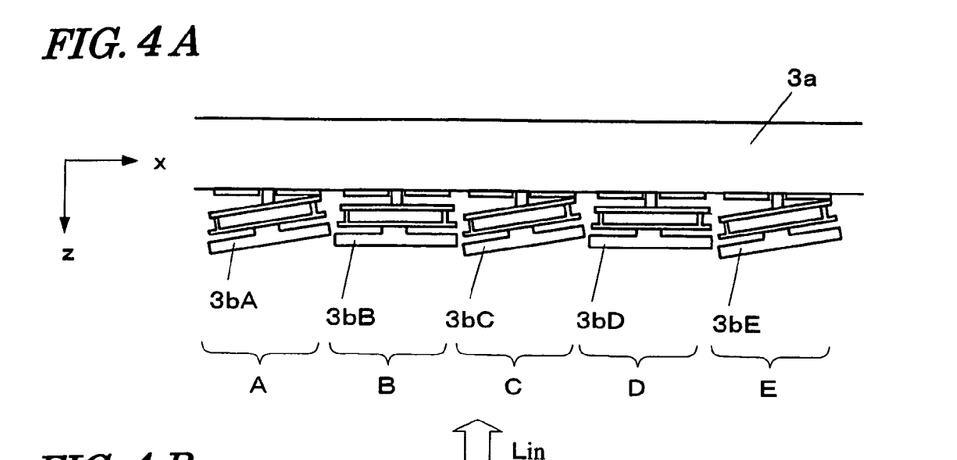
FIG. 4 shows how the position of the micromirror array 3 and the light quantity distribution on the projection plane change when no phase shift operation is carried out.

As shown in FIG. 4A, the micromirrors 3bA, 3bC and 3bE are in the first position to define dark portions on the photoresist 7. On the other hand, the other micromirrors 3bB and 3bD are in the second position and have a tilt angle of zero degrees and a zero displacement in the z direction. Accordingly, the light rays reflected from these two micromirrors 3bB and 3bD have the same phase, interfere with each other, and define bright portions on the photoresist 7.

Figure 4B:
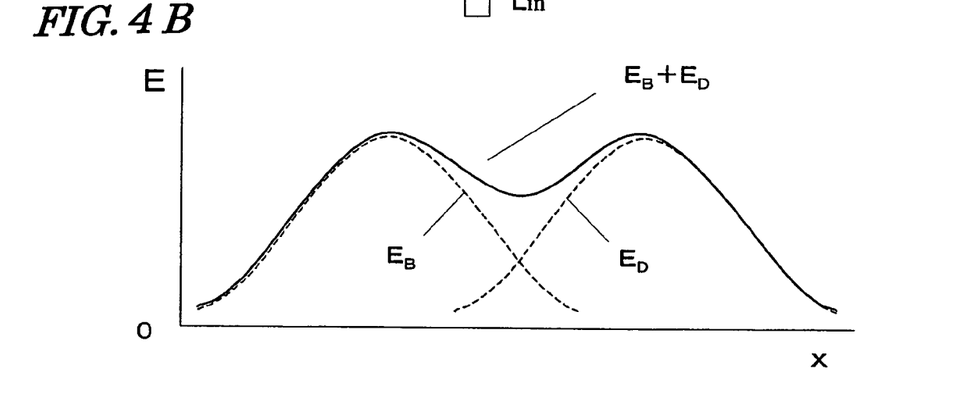

FIG. 4B shows the electric field intensity distribution on the photoresist 7. The electric field $E_B$ generated by the light reflected from the micromirror 3bB and the electric field $E_D$ generated by the light reflected from the micromirror 3bD have the same phase and the electric field distribution $E_B+E_D$ on the photoresist 7 has increased values at its skirts due to the overlapping portions.

Figure 4C:
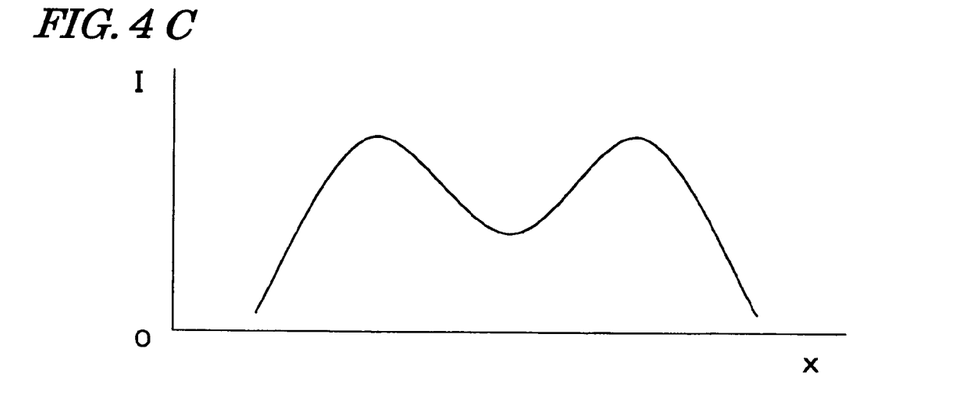

FIG. 4C shows the light quantity distribution on the photoresist 7. As can be seen from FIG. 4C, the contrast ratio between the two bright portions and the dark portion is low and it is difficult to separate the image components represented by these two bright portions. Thus, if the micromirrors 3b are tilted only with respect to the substrate 3a, the resolution of the resultant bright and dark pattern is low. On the other hand, if the micromirrors 3b are tilted with respect to the substrate 3a and/or displaced perpendicularly to the substrate 3a (as in FIG. 3), the resolution of the bright and dark pattern can be increased.

Figure 5:
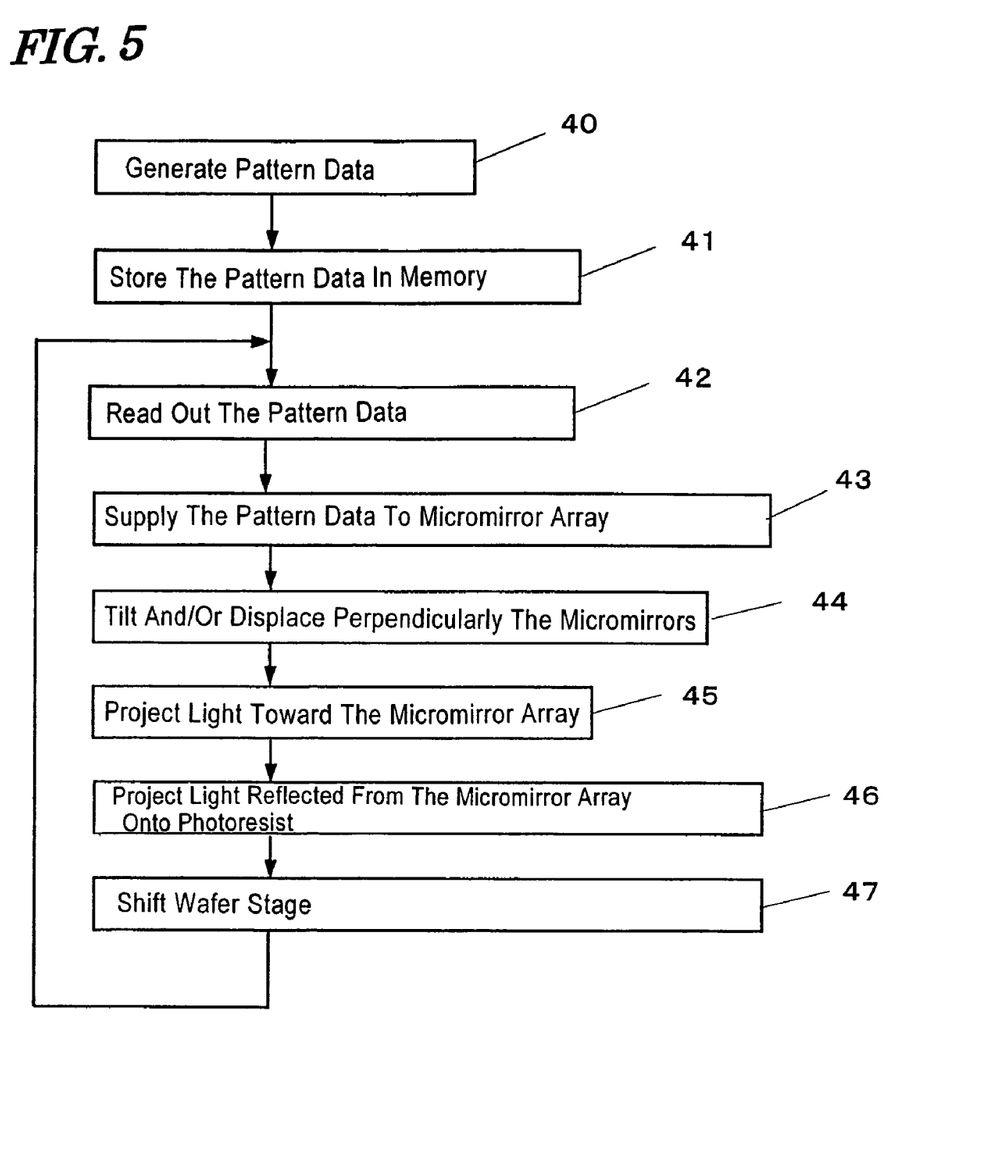
FIG. 5 is a flowchart showing respective process steps of a projection method according to a preferred embodiment of the present invention.

Hereinafter, a projection method according to a preferred embodiment of the present invention will be described with reference to FIG. 5, which is a flowchart showing respective process steps of a projection method according to a first preferred embodiment of the present invention.

First, in Step 40, pattern data to drive the micromirror array 3 is generated.

The pattern data is preferably generated with a CAD. To project a circuit pattern with sufficiently high resolution on the photoresist 7, three parameter values to be provided for each micromirror are determined. Those three parameter values are the tilt angle of the micromirror around the x-axis, the tilt angle thereof around the y-axis and the displacement thereof in the z direction. The best value of each of those parameters is obtained as multi-bit data of about 256 bits, for example.

These parameter values are optimized by performing simulations based on the physical models of exposure and development processes. The optical proximity effect is also corrected in this process step.

In a Levenson type phase shift mask, two adjacent bright portions basically have a phase difference of 180 degrees (i.e., have reverse phases). However, if the circuit pattern is a random pattern, those bright portions sometimes have to have the same phase here and there. That is to say, some "contradictory" portions are produced. Thus, the pattern data generator 4 sets the phase difference between two adjacent bright portions at such a contradictory portion to less than 180 degrees (e.g., 120 degrees). Then, that contradiction can be resolved with approximately the same degrees of phase differences produced in three bright portions. Alternatively, the tilt angles of portions of the micromirrors 3b, associated with the bright or dark portions, may be adjusted to control the light quantity distribution on the photoresist 7. In any case, by using such multi-bit pattern data, the circuit pattern can be arranged more flexibly and more densely.

The pattern data generated in this manner is stored in the memory of the pattern data generator in Step 41.

In performing a projection operation, the pattern data generator reads out the pattern data from the memory at a predetermined time in Step 42 and then supplies the data to the micromirror array 3 in Step 43.

Next, in accordance with this pattern data, the micromirrors 3b are tilted with respect to the substrate 3a and/or displaced perpendicularly to the substrate 3a in Step 44.

The pattern data is a combination of three multi-bit parameters and can have any of various values. But each pattern data always includes at least the following first, second and third pattern data sets. Specifically, the first pattern data set causes the micromirror 3b to take the first position, in which the micromirror 3b is tilted with respect to the substrate 3a by at least a predetermined angle θth, and deviates the reflected light substantially out of the aperture pupil of the projection optical system 5, thereby changing the amplitude of the modulated light to a predetermined value Ith or less. The second pattern data set causes the micromirror 3b to take the second position, in which the micromirror 3b is tilted with respect to the substrate 3a by less than the predetermined angle θth, and deviates the light reflected from the micromirror 3b within the aperture pupil of the projection optical system 5, thereby changing the amplitude of the modulated light to more than the predetermined value Ith. The third pattern data set causes the micromirror 3b to take the third position, in which the micromirror 3b is tilted with respect to the substrate 3a by less than the predetermined angle θth, and deviates the light reflected from the micromirror 3b within the aperture pupil of the projection optical system 5, thereby changing the amplitude of the modulated light to more than the predetermined value Ith. In addition, the third pattern data set produces a relative displacement perpendicularly to the substrate 3a between the micromirror 3b in the third position and the micromirror 3b in the second position so that the light rays reflected from these micromirrors 3b have a relative phase difference.

Meanwhile, the light source 1 produces either coherent light or partially coherent light and projects the light toward the micromirror array 3 in Step 45. The light reflected from the micromirror array 3 is projected in a reduced size by the projection optical system 5 onto the photoresist 7 in Step 46. When the photoresist 7 is exposed to the light for a predetermined amount of time, the wafer stage 8 will be shifted in Step 47. By repeatedly performing these process steps, the photoresists 7 can be exposed one after another.

As described above, according to this preferred embodiment, the micromirrors of the micromirror array to be driven in accordance with the pattern data generated by the pattern data generator are provided so as to be tilted with respect to the substrate and/or displaced perpendicularly to the substrate. As a result, while incoming light is being modulated, not only the amplitude but also the phase of the light can be changed substantially at the same time. By performing such phase conversion, the high resolution normally obtained by the phase shifting method can also be achieved, and a fine drawing pattern can also be formed on the projection plane, even by a projector and projection method that carries out the drawing operation directly without using any mask. Thus, a projector according to a preferred embodiment of the present invention needs no masks and can adaptively change the reflective surface of the micromirror array in accordance with the pattern data. Consequently, the projector can pick a required pattern from a huge number of drawings patterns instantaneously and draw it quickly enough.

In the preferred embodiment described above, the vertical displacement of the micromirrors 3b is controlled in multiple steps, and therefore, any arbitrary phase shift is easily realized with only the pattern data. Thus, a phase shifted pattern, which has been hard to realize by the conventional phase shifting method using masks, can also be defined. Specifically, in the conventional phase shift mask, the magnitude of phase shift is determined by the thickness of a transparent medium called a "phase shifter", and therefore, the multi-bit shifting and location-by-location shift optimization just complicated the mask making process in most cases. In contrast, according to this preferred embodiment, any modulator is allowed to produce arbitrary phase shift just by changing the pattern data, and a phase shift pattern can be generated very easily and flexibly.

In addition, the biaxial tilt angles of the micromirrors 3b are controlled in multiple steps by the pattern data generator 4, thus further increasing the controllability of the pattern being drawn on the projection plane. Thus, even in a random circuit pattern, which often results in decrease in resolution due to the interference at the aperture when the conventional Levenson type phase mask is used, the contradictory portions of the phase can be eliminated without widening the pattern-to-pattern distance excessively.

Furthermore, the pattern data generated by the pattern data generator 4 may not only represent a pattern to be drawn but also have the function of making the micromirror array 3 correct the aberration of the projection optical system 5. Such a function is achieved by separately guiding a portion of the light reflected from the photoresist 7 toward a wavefront sensor and getting the wavefront sensed by the wavefront sensor. By using such a configuration, the single micromirror array 3 can perform the two functions of defining a pattern to be drawn and correcting the aberration of the optical system at the same time.

In the preferred embodiment described above, the micromirror array 3 is used as a spatial light modulator and is made to substantially change the amplitude and/or phase of the incoming light, thereby increasing the resolution by the phase shifting technique. However, similar effects are also achieved even by using a spatial light modulator other than the micromirror array. For example, two liquid crystal panels may be provided to change the amplitude and to convert the phase, respectively, and used as spatial light modulators.

Furthermore, in the preferred embodiment described above, the light emitted from the light source 1 is supposed to be short-wave light with a wavelength that is short of the ultraviolet range. Alternatively, the light may also belong to any other wavelength range (e.g., may be visible radiation). Furthermore, the present invention can be used in not only projectors for lithography but also other display applications and photo printing applications as well.

It should be noted that the pattern data generator may or may not be a component of the projector. The pattern data needed to operate a projector according to a preferred embodiment of the present invention may be stored in either a storage medium included in the projector or a removable storage medium. Optionally, the pattern data may be prepared outside of the projector and then fed thereto by way of a telecommunications line.

A projector and projection method according to any of the preferred embodiments of the present invention is applicable for use not only in high-resolution lithography but also in display, photo printing and various other applications.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2003-332660 filed Sep. 25, 2003 and No. 2004-244884 filed Aug. 25, 2004, the entire contents of which are hereby incorporated by reference.

What is claimed is:

1. A projector comprising:
a spatial light modulator for spatially modulating incoming light in accordance with a pattern data that represents a pattern to be formed on a projection plane; and
a projection optical system for projecting the light, which has been reflected from the spatial light modulator, onto the projection plane in a reduced size,
wherein the spatial light modulator includes:
an array of micromirrors to be driven in accordance with the pattern data;
a substrate to support the array of micromirrors thereon; and
a driving section, which is able to change the tilt of each said micromirror with respect to the substrate and the displacement of the micromirror perpendicularly to the substrate on a micromirror-by-micromirror basis, and
wherein the driving section changes the position of each said micromirror in accordance with the pattern data, the position being defined by the displacement of the micromirror perpendicularly to the substrate and the tilt of the micromirror with respect to the substrate,
wherein the driving section allows each said micromirror to take one of three different positions, which are defined as first, second and third positions, respectively, in accordance with the pattern data,
wherein the micromirror in the first position tilts with respect to the substrate and deviates the reflected light substantially out of an aperture pupil of the projection optical system, and
wherein the micromirrors in the second and third positions displace perpendicularly to the substrate to mutually different degrees, but both deviate the reflected light out of the aperture pupil of the projection optical system.

2. The projector of claim 1, wherein the driving section is able to displace each said micromirror perpendicularly to the substrate in multiple steps in accordance with the pattern data.

3. The projector of claim 2, wherein the driving section changes the biaxial tilt of each said micromirror with respect to the substrate in multiple steps in accordance with the pattern data.

4. The projector of claim 1, wherein the driving section produces a phase difference between the light reflected by the micromirror in the second position and the light reflected by the micromirror in the third position so that the phase of the former light is reverse of that of the latter light.

5. The projector of claim 4, wherein the micromirror in the second position and the micromirror in the third position are adjacent to each other so as to interpose the micromirror in the first position between themselves.

6. The projector of claim 5, wherein the phase difference is substantially equal to 180 degrees.

7. The projector of claim 1, wherein the pattern data is generated by a pattern data generator, and
wherein the pattern data generator provides one of various combinations of multi-stage pattern data settings for each said micromirror so as to displace the micromirror perpendicularly to the substrate, and tilt the micromirror biaxially with respect to the substrate, differently from the other micromirrors.

8. The projector of claim 7, wherein the pattern data is provided so as to tilt each said micromirror biaxially with respect to the substrate in multiple stages.

9. The projector of claim 1, wherein the pattern to be formed on the projection plane is a pattern to define a circuit component, and
wherein the projection plane is defined on a photosensitive resist.

10. The projector of claim 1, wherein the pattern data generator generates pattern data to correct the aberration of the projection optical system.

11. A projector comprising:
a spatial light modulator, which receives pattern data, representing a pattern to be formed on a projection plane, and which spatially modulates incoming light in accordance with the pattern data; and
a projection optical system for projecting the light, which has been modulated by the spatial light modulator, onto the projection plane,
wherein the spatial light modulator includes an array of modulators, which are able to change the amplitude and/or phase of the incoming light in accordance with the pattern data, each said modulator selectively taking one of three different positions that are defined as first, second and third positions, respectively, and
wherein the modulator in the first position decreases the amplitude of the modulated light on the projection plane to less than a predetermined value, and
wherein the modulator in the second position keeps the amplitude of the modulated light on the projection plane equal to or greater than the predetermined value, and
wherein the modulator in the third position keeps the amplitude of the modulated light on the projection plane equal to or greater than the predetermined value and produces a phase difference with respect to the light modulated by the modulator in the second position.

12. An image forming method comprising the steps of:
driving a micromirror array, in which multiple micromirrors are arranged in columns and rows, thereby tilting the micromirrors and/or displacing the micromirrors along an optical axis on a micromirror-by-micromirror basis,
projecting light onto the micromirror array and then getting the light reflected from the micromirrors projected onto a projection plane in a reduced size by use of a projection optical system, thereby forming an image on the projection plane,
changing the position of each said micromirror, the position being defined by the tilt of the micromirror and/or the displacement of the micromirror along the optical axis, and
allowing each said micromirror to take one of three different positions, which are defined as first, second and third positions, respectively, and
wherein the micromirror in the first position tilts and deviates the reflected light substantially out of an aperture pupil of the projection optical system, and wherein the micromirrors in the second and third positions displace along the optical axis to mutually different degrees, but both deviate the reflected light out of the aperture pupil of the projection optical system.

13. A projection method comprising the steps of:

providing a spatial light modulator including a plurality of modulators, each of which is able to change the amplitude and/or phase of light;

allowing light to enter the spatial light modulator, getting the light modulated by the modulators, and then projecting the modulated light onto a projection plane, thereby forming an image; and inputting first, second and third pattern data to the spatial light modulator, the first pattern data being defined such that the amplitude of the modulated light on the projection plane is decreased to less than a predetermined value, the second pattern data being defined such that the amplitude of the modulated light on the projection plane is kept equal to or greater than the predetermined value, the third pattern data being defined such that the amplitude of the modulated light on the projection plane is kept equal to or greater than the predetermined value and that a phase difference is produced with respect to the light that has been modulated by the modulator provided with the second pattern data.

\* \* \* \* \*